United States Patent
Hupe et al.

(12)

(10) Patent No.: US 6,576,111 B1
(45) Date of Patent: Jun. 10, 2003

(54) PROCESS FOR THE COPPER PLATING OF SUBSTRATES

(75) Inventors: Jürgen Hupe, Langenfeld (DE); Walter Kronenberg, Cologne (DE); Eugen Breitkreuz, Taoynan Hsien (TW); Ulrich Schmergel, Solingen (DE)

(73) Assignee: Balsberg Oberflächentechnik GmbH, Solingen (DE)

( * ) Notice: Subject to any disclaimer, the term of this patent is extended or adjusted under 35 U.S.C. 154(b) by 0 days.

(21) Appl. No.: 09/674,509

(22) PCT Filed: May 14, 1999

(86) PCT No.: PCT/EP99/03321

§ 371 (c)(1), (2), (4) Date: Dec. 28, 2000

(87) PCT Pub. No.: WO99/60188

PCT Pub. Date: Nov. 25, 1999

(30) Foreign Application Priority Data

May 16, 1998 (DE) .......................................... 198 22 076

(51) Int. Cl.⁷ ............................ C25D 3/38; C25D 21/18
(52) U.S. Cl. ........................ 205/101; 205/125; 205/296
(58) Field of Search ........................ 205/101, 99, 125, 205/296

(56) References Cited

U.S. PATENT DOCUMENTS 5,186,811 A     2/1993   Otani et al.

FOREIGN PATENT DOCUMENTS

| DE | 1 496 772 | 4/1971 |
| DE | 40 01 960 A1 | 7/1991 |
| EP | 0 137 397 A | 4/1985 |
| JP | 62-112996 | * 5/1987 |

* cited by examiner

*Primary Examiner*—Roy King
*Assistant Examiner*—William T. Leader
(74) *Attorney, Agent, or Firm*—Jacobson Holman PLLC

(57) ABSTRACT

A process for the copper plating of substrates using insoluble anodes in acidic copper baths with separate replenishing of consumed copper ions, characterized in that the major portion of the copper ions is directly supplied in the form of copper carbonate and/or basic copper carbonate, dispensing with diaphragms and auxiliary electrolytes, in a separate tank operated in a bypass mode with respect to the working electrolyte, the released gaseous $CO_2$ being separated off in said separate tank.

4 Claims, No Drawings

PROCESS FOR THE COPPER PLATING OF SUBSTRATES

The present invention relates to a process for the copper plating of substrates using insoluble anodes in acidic copper baths with separate replenishing of consumed copper ions.

The use of insoluble anodes for the metal-plating of printed circuit boards, especially in horizontal flow-through plants, requires a continuous supply of copper ions into the process solution from outside since the dissolution of copper anodes in the process electrolyte is eliminated. In parallel, the organic electrolyte additives which are responsible for the physical properties of the copper layer to be deposited and its distribution over the work-piece must also be replenished.

According to DE-A-44 05 741, this is done by dissolving metal in a separate "regenerating cell". In order to promote this process to the necessary extent, redox systems are added. There is a problem, on the one hand, in solubilizing the necessary amounts of copper ions, and on the other hand, in that a substantially uncontrollable change of the organic additives beyond the destructive processes occurring at the anode additionally arises due to the redox system. This makes it fairly difficult to achieve a reproducible depositing quality over extended production periods since the organic additive system, which consists of a number of different organic compounds, can very easily get out of balance and out of control. The redox processes produce side products which additionally change the bath and deposition characteristics. In addition, the oxidative degradation makes it necessary to supply major amounts of additional organics into the process electrolyte. This in turn significantly adds to the production costs, and if necessary, a correction must be done by appropriate cleaning measures, e.g., filtration through active charcoal. All this is uneconomic and counterproductive.

DE 195 39 865 describes a process which is supposed to dispense with the use of such additional redox systems. In a separate regenerating space, the supply of metal ions is enabled using a soluble anode. At the same time, an auxiliary cathode is used which is kept free from metal deposition by appropriate means. According to a further development of this solution, the insoluble anodes of the electrolytic cell are provided in an auxiliary anolyte which is separated from the electrolyte by anion-impermeable diaphragms. It is to be considered a drawback that the quantities of metal ions necessary upon ageing of the production are difficult to be dissolved in sufficient amounts, or very large volumes of regenerating space with a very large number of anodes are necessary. The double destruction of the process organics is not avoided by this method either.

In principle, it appears to be little economic and ecologic to work with insoluble anodes, but to replenish the metal ions into the process via a bypass through the dissolution of metal anodes.

EP 0 667 923 describes a process for the electrolytic coating of, for example, steel with copper using insoluble anodes, e.g., platinum coated with iridium oxide, from a copper pyrophosphate electrolyte. The necessary replenishing of the copper ions is effected by the addition of copper hydroxide. It is to be taken care that the pyrophosphate electrolyte is employed in an alkaline pH range, while for the metal plating of printed circuit boards, for example, sulfuric acid electrolytes are preferred.

It has been the object of the present invention to provide a copper electrolyte, preferably based on sulfuric acid, which is suitable for the use of insoluble anodes, especially in flow-through plants, in direct current and/or pulse reverse plating without causing a significant adverse affection of the organic additives or a major degradation of these organics or an enhanced production of side products. Further, the replenishing of the metal ions shall be effected to avoid additional interfering changes in the process organics. The operation of the whole electrolytic system including process organics and copper ion regeneration shall be cost-saving, raw-material saving and environment-friendly without accepting disadvantages in technical quality. Further, diaphragms and auxiliary electrolytes shall be dispensed with.

According to the invention, this object is achieved by directly supplying the major portion of the copper ions in the form of copper carbonate and/or basic copper carbonate, dispensing with diaphragms and auxiliary electrolytes, in a separate tank operated in a bypass mode with respect to the working electrolyte, the released gaseous $CO_2$ being separated off in said separate tank.

Preferably, copper baths are used in which the organic components are polymers prepared by the polymerization of bifunctional propane derivatives with one or more unsaturated alcohols with 3 to 10 carbon atoms and one or more double and/or triple bonds.

Such baths are described, for example, in EP-A-0 137 397. Those sulfuric acid electrolytes generally contain only components which do not form any degradation products and by no means adversely affect the quality of the deposited precipitate or interfere with the balance of the system during the electrolytic process. It has been found that these very additives are particularly suitable for the use in flow-through plants.

According to the invention, the problem of replenishing the electroplated copper ions is solved through the addition of copper salts. The addition of copper(II) sulfate or sure copper(II) hydroxide is out of the question, however, since in the first case, too high an enrichment with sulfate ions in the electrolyte could not be avoided, and in the second case, neutralization processes would adversely affect efficiency.

It has been found that the addition of copper(II) carbonate and/or basic copper(II) carbonate, optionally in connection with low amounts of other copper salts, such as copper (II) sulfate, to the electrolytic system provides good results in terms of the object of the invention.

Since the dissolution of copper(II) carbonate generates $CO_2$ and thus a remarkable evolution of gas and clouding of the solution occur, measures are taken for avoiding a strong influence of the gas evolution on the electrolytic copper deposition.

Therefore, the dissolution of the copper salts is effected in a separate tank which is operated in a bypass mode with respect to the working electrolyte.

To this end, the container is equipped with a stirrer and heating in order to make the dissolution process as fast and thus as economic as possible. The very high temperature resistance of the additive according to EP 0 137 397 has the effect that virtually no reduction of the electrochemical activity occurs during the dissolution process at elevated temperature.

Virtually no extra additions of additive are required, which would reduce the economic efficiency of the process, as can be observed in most cases for electrolytes having several components. The feeding into the process electrolyte is preferably effected via a pump system with a filtration unit. Thus, interferences with the electrolytic process can be completely avoided.

In another preferred embodiment of the invention, used-up copper etching solutions are recycled in an environment-friendly manner and converted to copper carbonate by the addition of sodium carbonate, for example. Usually, such copper etching solutions contain copper ions and mineral acids, for example, hydrochloric acid, sulfuric acid etc., and optionally oxidants as well as stabilizers. Such etching solutions can be collected and pooled. Further, anode residues or printed circuit board scraps can be additionally dissolved in the solution while air is blown in. For example, the solutions are transferred into a second tank through active charcoal filters. Then, the pH of this solution is adjusted to a value below the precipitation pH of $Cu(OH)_2$ by adding aqueous sodium hydroxide, for example, or other suitable alkaline solutions. This neutralization prevents unnecessarily high amounts of $CO_2$ from being released during the reaction of acid with carbonate. The suction means and its performance can be reduced and thus operated in an economically clearly more efficient way. By the addition of, e.g., $Na_2CO_3$ with vigorous stirring, $CUCO_3$ is formed and precipitates from the solution. The supernatant becomes clear. After an adequate reaction time, the supernatant clear phase is cautiously filtered off. Water is added to the $CuCO_3$, the mixture is stirred, and the whole process is repeated. The residual copper carbonate is dried and can be employed for replenishing the copper ions according to the invention.

The working parameters for the sulfuric acid electrolyte are generally as follows:

|  |  | preferably |
|---|---|---|
| $Cu^{2+}$ | 15 to 40 g/l | 20 to 30 g/l |
| $H_2SO_4$ | 150 to 300 g/l | 200 to 250 g/l |
| $Cl^-$ | 30 to 100 mg/l | 60 to 80 mg/l |
| additive* | 4 to 10 ml/l | 4 to 10 ml/l |
| working temperature | 20 to 50° C. | 25 to 35° C. |

*Cuprostar LP-1 (one-component additive according to EP 0 137 397)

The mentioned parameters mainly relate to operation in horizontal flow. All prior art plating plants of this type can be employed.

The copper precipitates prepared by the process according to the invention are finely crystalline with a satin appearance, almost free from inner strains, ductile and have a high tensile strength. They are smooth and thus free of protrusions or pores. The quality tests usual in the trade (e.g., according to MIL SPEC 55 110) are passed without difficulty. The electrolyte has an excellent uniform metal distribution over the surface and a very high spreadability, e.g., in the bores of printed circuit boards.

The process according to the invention is further illustrated in the following Example.

EXAMPLE

Electrolyte Formulation

| | |
|---|---|
| $H_2SO_4$: | 192.5 g/l |
| $Cu^{2+}$: | 20.0 g/l |
| $Cl^-$: | 62 mg/l |
| additive (LP-1): | 6 ml/l |
| temperature: | 35 ± 1° C. |
| mechanical agitation of the bath | |
| anodes: | Pt expanded metal |
| current density: | 2 A/dm$^2$ |
| After a galvanic period of 150 min, 8.9 g/l | |
| of copper had been deposited. | |
| Analysis $H_2SO_4$: | 204 g/l |
| Addition of 15.5 g/l | |
| $CuCO_3 \cdot Cu(OH)_2$ (=8.9 g/l $Cu^{2+}$) | |
| Analysis $H_2SO_4$ after addition: | 189.7 g/l |
| Second galvanic period: | |
| Copper deposited: | 9.1 g/l |
| $H_2SO_4$ analysis: | 202 g/l |
| Addition of 15.8 g/l $CuCO_3 \cdot Cu(OH)_2$ | |
| Analysis $H_2SO_4$: | 189 g/l |

The deposition quality from the electrolyte met the technical requirements in all cases.

Further use of the electrolyte did not result in any problems even after 20 galvanic periods.

What is claimed is:

1. A process for copper plating of printed circuit boards comprising the steps of plating a printed circuit board in an acid copper bath containing organic components using an insoluble anode, with separate replenishing of consumed copper ions, the copper plating being performed in a process electrolyte tank and supplying a major portion of copper ions to the acid copper bath by (a) dissolving copper carbonate and/or basic copper carbonate in acid with stirring and heating in a bypass tank and separating off released gaseous $CO_2$ followed by (b) feeding into the process electrolyte tank, whereby the process dispenses with diaphragms and auxiliary electrolytes, and whereby the circuit board is provided with a uniform, smooth, and fine crystalline copper plating.

2. The process according to claim 1, characterized in that the organic components in said copper baths are polymers prepared by the polymerization of bifunctional propane derivatives with one or more unsaturated alcohols with 3 to 10 carbon atoms and one or more double and/or triple bonds.

3. The process according to claim 1 or 2, characterized in that said copper carbonate is prepared by precipitation from copper salt solutions using sodium carbonate.

4. The process according to claim 3, characterized in that said copper salt solutions are neutralized to a pH value below the precipitation pH of copper hydroxide using aqueous sodium hydroxide prior to said precipitation.

* * * * *

UNITED STATES PATENT AND TRADEMARK OFFICE
CERTIFICATE OF CORRECTION

PATENT NO. : 6,576,111 B1
DATED : June 10, 2003
INVENTOR(S) : Hupe et al.

It is certified that error appears in the above-identified patent and that said Letters Patent is hereby corrected as shown below:

Title page,
Item [73], change "Balsberg" to -- Blasberg --

Column 3,
Line 18, change "$CUCO_3$" to -- $CuCO_3$ --

Signed and Sealed this

Thirtieth Day of March, 2004

JON W. DUDAS
*Acting Director of the United States Patent and Trademark Office*